（12） United States Patent
Wu et al.

(10) Patent No.: US 11,243,890 B2
(45) Date of Patent: Feb. 8, 2022

(54) COMPRESSED DATA VERIFICATION

(71) Applicant: EMC IP Holding Company LLC, Hopkinton, MA (US)

(72) Inventors: Peng Wu, Westborough, MA (US); Rong Yu, West Roxbury, MA (US); Tao Gong, Acton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 16 days.

(21) Appl. No.: 16/742,201

(22) Filed: Jan. 14, 2020

(65) Prior Publication Data

US 2021/0216468 A1 Jul. 15, 2021

(51) Int. Cl.
*G06F 12/0897* (2016.01)

(52) U.S. Cl.
CPC .. *G06F 12/0897* (2013.01); *G06F 2212/1032* (2013.01); *G06F 2212/401* (2013.01)

(58) Field of Classification Search
None
See application file for complete search history.

(56) References Cited

U.S. PATENT DOCUMENTS

| | | | | |
|---|---|---|---|---|
| 7,190,284 | B1* | 3/2007 | Dye | H03M 7/30 |
| | | | | 341/51 |
| 2006/0184505 | A1* | 8/2006 | Kedem | G06F 3/0608 |
| 2006/0271761 | A1* | 11/2006 | Riemens | G06F 12/08 |
| | | | | 711/212 |
| 2013/0024434 | A1* | 1/2013 | Dykeman | G06F 16/217 |
| | | | | 707/693 |
| 2013/0290615 | A1* | 10/2013 | Shah | G06F 3/0679 |
| | | | | 711/103 |
| 2015/0161155 | A1* | 6/2015 | Pletcher | G06F 3/0643 |
| | | | | 707/693 |
| 2016/0041829 | A1* | 2/2016 | Singh | G06F 9/4401 |
| | | | | 713/2 |
| 2018/0152201 | A1* | 5/2018 | Gopal | G06F 11/3034 |
| 2018/0254784 | A1* | 9/2018 | Resch | G06F 11/1076 |

* cited by examiner

*Primary Examiner* — Stephanie Wu
(74) *Attorney, Agent, or Firm* — Krishnendu Gupta; Nikhil Patel

(57) ABSTRACT

Embodiments of the present disclosure relate to verifying compressed data. Compressed data files can be read from a global cache for a storage device into a local buffer. A data verification level of a plurality of data verification levels can be selected to perform on the compressed data files. An amount of data blocks of each data file can be decompressed based on the determined data verification level. An integrity of the compressed data files verified using the decompressed data blocks.

18 Claims, 4 Drawing Sheets

COMPRESSED DATA VERIFICATION

BACKGROUND

Data compression techniques can reduce a number of bits needed to represent data. Such techniques can save storage capacity, speed up file transfer, and decrease costs for storage hardware and network bandwidth. Compression can be performed by a program that uses a formula or algorithm to determine how to shrink the size of the data. For instance, an algorithm may represent a string of bits—or 0s and 1s—with a smaller string of 0s and 1s by using a dictionary for the conversion between them, or the formula may insert a reference or pointer to a string of 0s and 1s that the program has already seen. Data compression can dramatically decrease the amount of storage a file takes up. For example, in a 2:1 compression ratio, a 20-megabyte (MB) file takes up 10 MB of space.

SUMMARY

One or more aspects of the present disclosure relate to verifying integrities of compressed data.

In embodiments, compressed data files are read from a global cache for a storage device and written into a local buffer. A data verification level of a plurality of data verification levels are selected to perform on the compressed data files. An amount of data blocks of each data file is decompressed based on the determined data verification level. An integrity of the compressed data files is verified using the decompressed data blocks.

In embodiments, the plurality of data verification levels can include at least a first compression verification level and a second verification level. Each verification level can require distinct computing resources and a distinct verification response time.

In embodiments, selecting the data verification level can include determining telemetry information of the storage device.

In embodiments, the selected data verification level can be based on the determined telemetry information.

In embodiments, a single data block of each read compressed data file can be decompressed in response to selecting a data verification level having a verification response time less than a threshold.

In embodiments, each single decompressed data block of each compressed data file can be compared to at least one data block of a corresponding uncompressed data file stored in global memory.

In embodiments, the comparison can include determining a similarity between information contained a cyclic redundancy check (CRC) field and a data integrity field (DIF) of the single data block and the at least one data block of the corresponding uncompressed data file. A similarity finding can indicate that the read compressed data files from the global cache are verified. A lack of a similarity finding can indicate that the read compressed data files from the global cache are unverified.

In embodiments, two or more data blocks of each read compressed data file can be decompressed in response to selecting a data verification level having a verification response time greater than a threshold.

In embodiments, each of the two or more decompressed data block of each compressed data file can be compared to a plurality of data blocks of a corresponding uncompressed data file stored in global memory. The comparison can include determining a similarity between information contained a cyclic redundancy check (CRC) field and a data integrity field (DIF) of the single data block and the at least one data block of the corresponding uncompressed data file. A similarity finding can indicate that the read compressed data files from the global cache are verified. A lack of a similarity finding can indicate that the read compressed data files from the global cache are unverified.

In embodiments, all verified compressed data files can be written to one or more disks of the storage device.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Data compression is an efficiency feature that allows users to store compressed data using less storage capacity than uncompressed data. With data compression, users can significantly increase storage utilization for data such as file data and block data. Data compression can be characterized as the process of encoding source information using an encoding scheme into a compressed form having fewer bits than the original or source information. Different encoding schemes may be used in connection with data compression and have different data reduction ratios (DRR), also referred herein as "data compression ratio".

In some circumstances, data can become vulnerable to attack and/or corruption before and/or during compression. For example, a storage device can encounter hardware and/or software errors that can corrupt data during compression. Such corruption can result in valid data loss. For instance, uncompressed and original versions of compressed data are discarded from a storage device's volatile memory (e.g., cache) in response to its compressed counterpart being stored to disk. Thus, if the compressed counterpart is corrupted and not verified before being stored to disk, the original and valid data is discarded and lost.

Embodiments of the present disclosure verify compressed data before storing it in disk. For instance, the embodiments can include obtaining compressed data being cached by a storage device's global memory prior to it being written to disk. The embodiments can further perform a verification process on the compressed data to assure it is uncompromised and corresponds to its original version. The verification process can include performing one or more reverse compression steps on the compressed data. The process can further compare the reverse compressed data to its original version. Based on the results of the comparison, the process can include either reporting an error in response to detecting a mismatch or writing the compressed data to disk in response to detecting a match. Additional details regarding embodiments of the verification process are described in greater detail herein.

Figure 1:
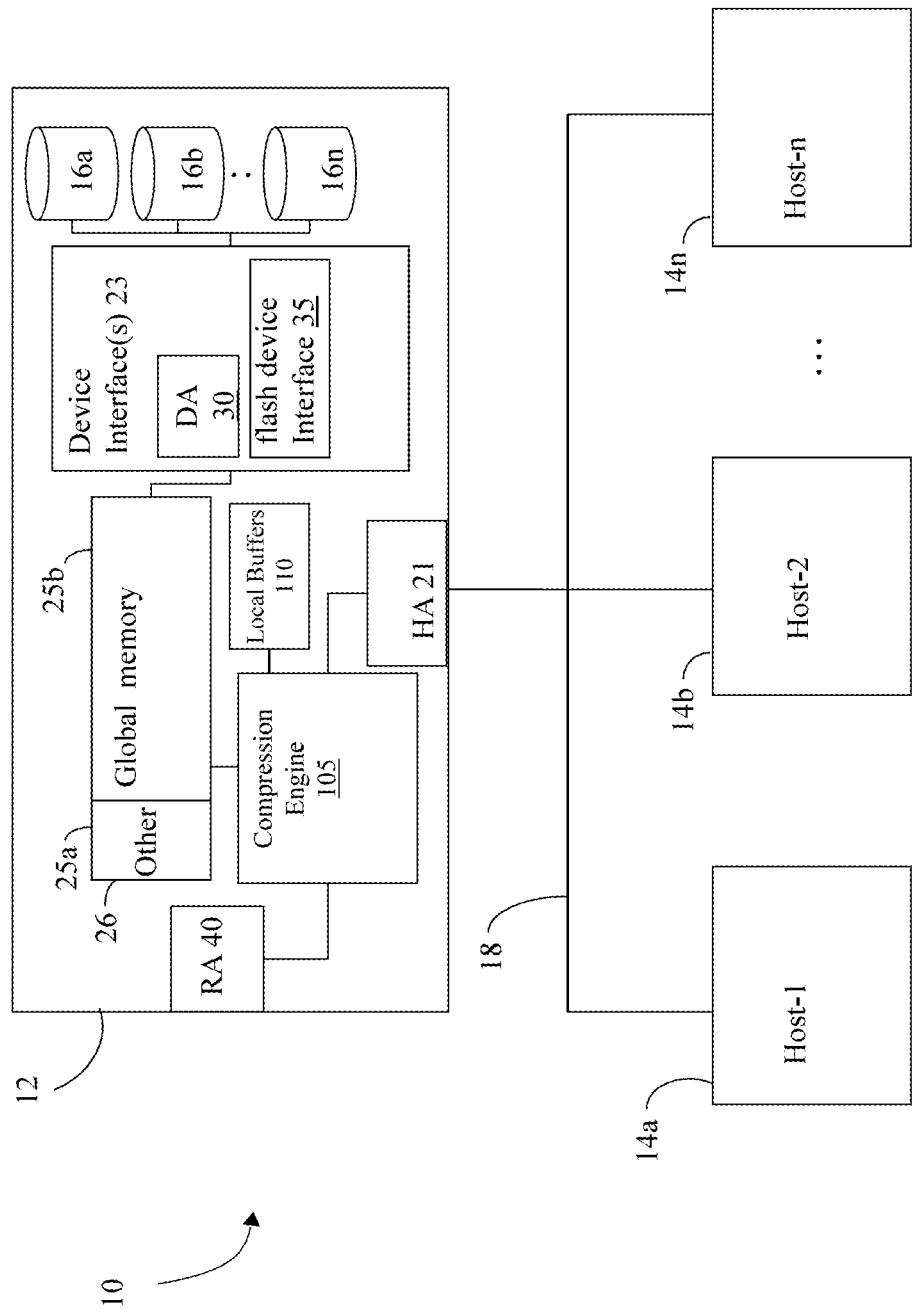
FIG. 1 is a block diagram of a storage system in accordance with example embodiments disclosed herein.

Referring to FIG. 1, shown is an example of an embodiment of a system 10 that may be used in connection with performing the embodiments described herein. The system 10 includes a data storage system 12 connected to host systems 14a-14n through communication medium 18. In embodiments, the hosts 14a-14n can access the data storage system 12, for example, to perform input/output (I/O) operations or data requests. The communication medium 18 can be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host 14a-14n can access and communicate with the data storage system 12. The hosts 14a-14n can also communicate with other components included in the system 10 via the communication medium 18.

Each of the hosts 14a-14n and the data storage system 12 can be connected to the communication medium 18 by any one of a variety of connections as may be provided and supported in accordance with the type of communication medium 18. The processors included in the hosts 14a-14n may be any one of a variety of proprietary or commercially available single or multi-processor system, such as an Intel-based processor, or other type of commercially available processor able to support traffic in accordance with each embodiment and application.

It should be noted that the examples of the hardware and software that may be included in the data storage system 12 are described herein in more detail and can vary with each embodiment. Each of the hosts 14a-14n and data storage system 12 can all be located at the same physical site or can be located in different physical locations. Examples of the communication medium 18 that can be used to provide the different types of connections between the host computer systems and the data storage system of the system 10 can use a variety of different communication protocols such as SCSI, Fibre Channel, iSCSI, Non-Volatile Memory Express (NVMe), and the like. Some or all the connections by which the hosts 14a-14n and data storage system 12 can be connected to the communication medium may pass through other communication devices, such switching equipment that may exist such as a phone line, a repeater, a multiplexer or even a satellite.

Each of the hosts 14a-14n can perform different types of data operations in accordance with different types of tasks. In embodiments, any one of the hosts 14a-14n may issue a data request to the data storage system 12 to perform a data operation. For example, an application executing on one of the hosts 14a-14n can perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN, in an embodiment using the embodiments herein. It should also be noted that an embodiment may include data storage arrays or other components from one or more vendors. In subsequent examples illustrated the embodiments herein, reference may be made to a single data storage array by a vendor, such as by DELL Technologies of Hopkinton, Mass. However, as will be appreciated by those skilled in the art, the embodiments herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash devices or flash memory-based SSDs are one type of SSD that contains no moving parts. The embodiments described herein can be used in an embodiment in which one or more of the devices 16a-16n are flash drives or devices. More generally, the embodiments herein may also be used with any type of SSD although following paragraphs can refer to a particular type such as a flash device or flash memory device.

The data storage array 12 may also include different types of adapters or directors, such as an HA 21 (host adapter), RA 40 (remote adapter), and/or device interface 23. Each of the adapters HA 21, RA 40 may be implemented using hardware including a processor with local memory with code stored thereon for execution in connection with performing different operations. The HA 21 may be used to manage communications and data operations between one or more host systems 14a-14n and the global memory (GM) 25b. In an embodiment, the HA 21 may be a Fibre Channel Adapter (FA) or another adapter which facilitates host communication. The HA 21 may be characterized as a front-end component of the data storage system 12 which receives a request from one or more of the hosts 14a-14n. The data storage array 12 can include one or more RAs (e.g., RA 40) that may be used, for example, to facilitate communications between data storage arrays. The data storage array 12 may also include one or more device interfaces 23 for facilitating data transfers to/from the data storage devices 16a-16n. The data storage interfaces 23 may include device interface modules, for example, one or more disk adapters (DAs) 30 (e.g., disk controllers), flash drive interface 35, and the like. The DA 30 can be characterized as a back-end component of the data storage system 12 which interfaces with the physical data storage devices 16a-n.

One or more internal logical communication paths may exist between the device interfaces 23, the RAs 40, the HAs 21, and the memory 26. An embodiment, for example, may use one or more internal busses and/or communication modules. For example, the global memory 25b can be used to facilitate data transfers and other communications between the device interfaces, HAs and/or RAs in a data storage array. In one embodiment, the device interfaces 23 may perform data operations using a cache that may be included in the global memory 25b, for example, when communicating with other device interfaces and other components of the data storage array. Memory portion 25a is a portion of memory 26 that may be used in connection with other designations that may vary in accordance with each embodiment.

The data storage system as described in this embodiment, or a device thereof, such as a disk or aspects of a flash device, should not be construed as a limitation. Other types of commercially available data storage systems, as well as processors and hardware controlling access to these devices, may also be included in an embodiment.

Host systems 14a-14n provide data and access control information through channels (e.g., via communications medium 18) to the storage systems 12, and the storage systems 12 may also provide data to the host systems 14a-14n also through the channels. In embodiments, the host systems 14a-14n may not be configured to address the drives or devices 16a-16n of the storage systems directly, but rather access to data can be provided to one or more host systems 14a-n from what the host systems view as a plurality of logical devices or logical volumes (LVs). The LVs may or may not correspond to the actual physical devices or drives 16a-16n. For example, one or more LVs may reside on a single physical drive or multiple drives. Data in a single data storage system, such as a single data storage array 12, may be accessed by multiple hosts allowing the hosts to share the data residing therein. The HA 21 may be used in connection with communications between a data storage array 12 and one or more of the host systems 14a-n. The RA 40 may be used in facilitating communications between two data storage arrays. The DA 30 may be one type of device interface used in connection with facilitating data transfers to/from the associated disk drive(s) 16a-n and LV(s) residing thereon. A flash device interface 35 may be another type of device interface used in connection with facilitating data transfers to/from the associated flash devices and LV(s) residing thereon. It should be noted that an embodiment may use the same or a different device interface for one or more different types of devices than as described herein.

The device interface, such as a DA 30, performs I/O operations on a drive 16a-16n. In the following description, data residing on an LV may be accessed by the device interface following a data request in connection with I/O operations that other directors originate. Data may be accessed by LV in which a single device interface manages data requests in connection with the different one or more LVs that may reside on a drive 16a-16n. For example, a device interface may be a DA 30 that accomplishes the foregoing by creating job records for the different LVs associated with a device. These different job records may be associated with the different LVs in a data structure stored and managed by each device interface.

The device 12 can include a compression engine 105 configured to verify compressed data as discussed in greater detail herein. Briefly, the engine 105 can read compressed data files from cache slots (e.g., slots 315a-n of FIG. 3) of the global memory 25b. In embodiments, the engine 105 can read and then write the compressed data to one or more local buffers 110. The local buffers 110 can be one or more of any known types of buffers.

In embodiments, the cache slots can correspond to the global memory's back-end cache slots. The back-end cache slots can include a set of the global memory's cache slots designated to temporarily store data that is to be de-staged to, e.g., DA 30 for storage in one or more of the disks 16a-n. The set of the global memory's cache slots can be designated as back-end cache slots according to any known and/or yet to be known technique.

In response to reading the compressed data from global memory 25b, the engine 105 can verify the compressed data according to any of the techniques described herein. In embodiments, the engine 105 can performing one or more reverse compression steps on the compressed data. The engine 105 can store the reversed compress data in one of the local buffers 105 designated to store such data. Using the reverse compressed data, the engine 105 compare the reverse compressed data to its original uncompressed version. Based on the results of the comparison, the engine 105 can report an error in response to detecting a mismatch. Alternatively, in response to detecting a match, the engine 105 can release the compress data from the local buffer 110 for the DA 30 to write it to disk.

It should be noted that the compression engine 105 may exist external to the data storage system 12 and may communicate with the data storage system 12 using any one of a variety of communication connections. In other embodiments, the compression engine 105 may exist internal to the data storage system 12 and consume shared resources of the system 12, e.g., share the system's processing resources. In one embodiment, the compression engine 105 may communicate with the data storage system 12 through several different connections including, but not limited to, a serial port, a parallel port, and a network interface card via an Ethernet connection. Using the Ethernet connection, for example, the compression engine 105 may communicate directly with DA 30 and HA 21 within the data storage system 12.

Figure 2:
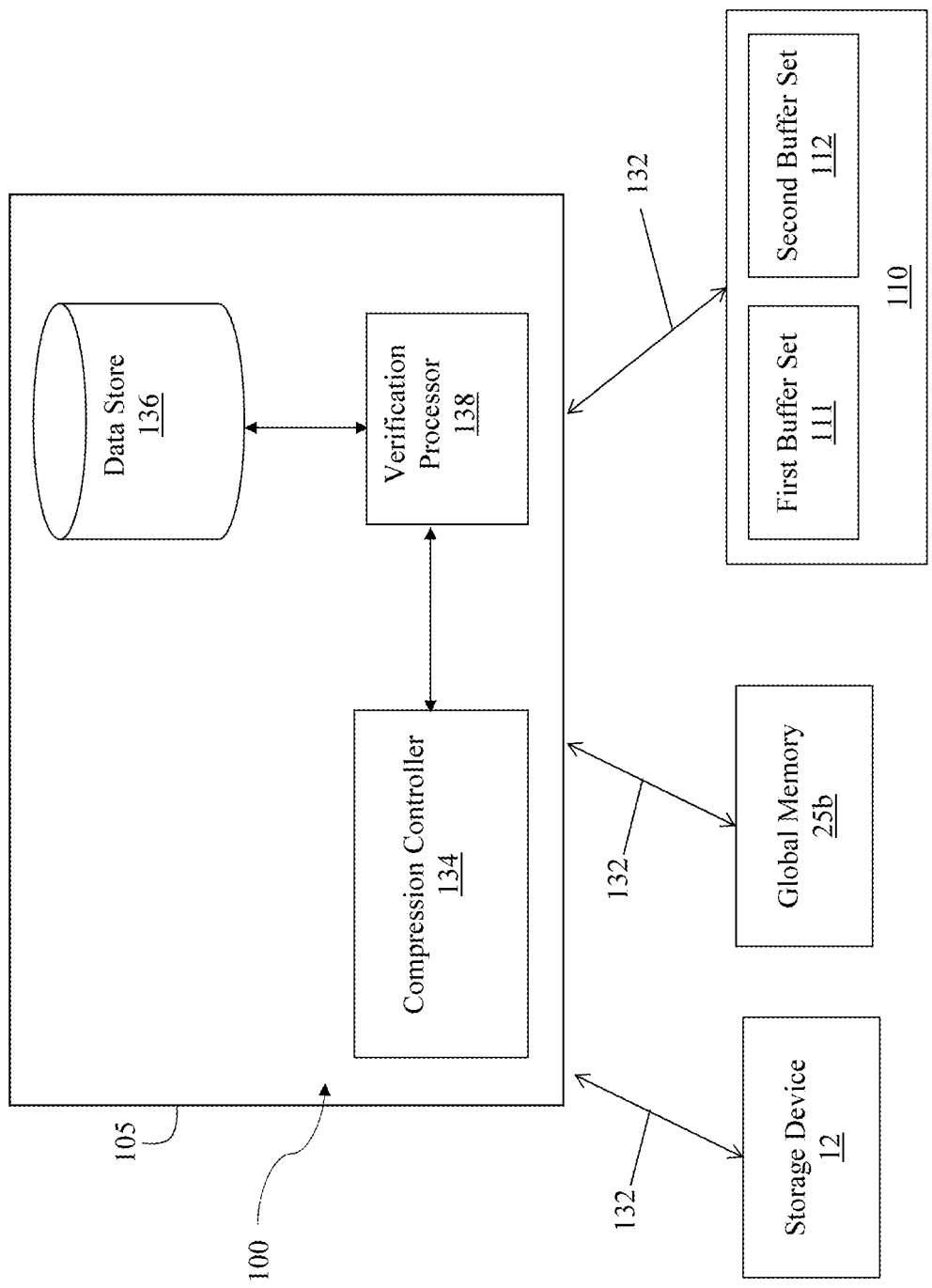
FIG. 2 is a block diagram of a compression engine in accordance with example embodiments disclosed herein.

Referring to FIG. 2, the compression engine 105, in embodiments, can include elements 100 (e.g., software and hardware elements). It should be noted that the compression engine 105 and/or any of its elements 100 can be any one of a variety of commercially available processors, such as an Intel-based processor, and the like. Although what is described herein shows details of elements 100 that can include software that reside in the compression engine 105, all or portions of the illustrated elements 100 can also reside elsewhere such as, for example, on HA 21 or DA 30 of FIG. 1. In other embodiments, the compression engine 105 can be a parallel processor such as a graphical processing unit (GPU).

The compression engine 105 can include a compression controller 134 which monitors one or more processing threads (e.g., input/output (I/O) operations such as read/write operations) of the data storage system 12 through the communication medium 132 (e.g., a Fibre channel). The medium 132 can communicatively couple the controller 134 to each of the system's 12 components. Accordingly, the controller 134 can monitor and global memory 25b and the system 12, as a whole, to perform compression verification. In embodiments, the controller 134 can monitor and collect telemetry data of the storage system 12 according to any known technique. For example, the techniques can include using one or more daemons that generate system log files for each of the device's components as illustrated in FIG. 1. The controller 134 can store the telemetry data in data store 136. In embodiments, the controller 134 can also monitor one or more cache slots (e.g., slots 315a-n of FIG. 3) of the global memory 25b using such techniques.

Figure 3:
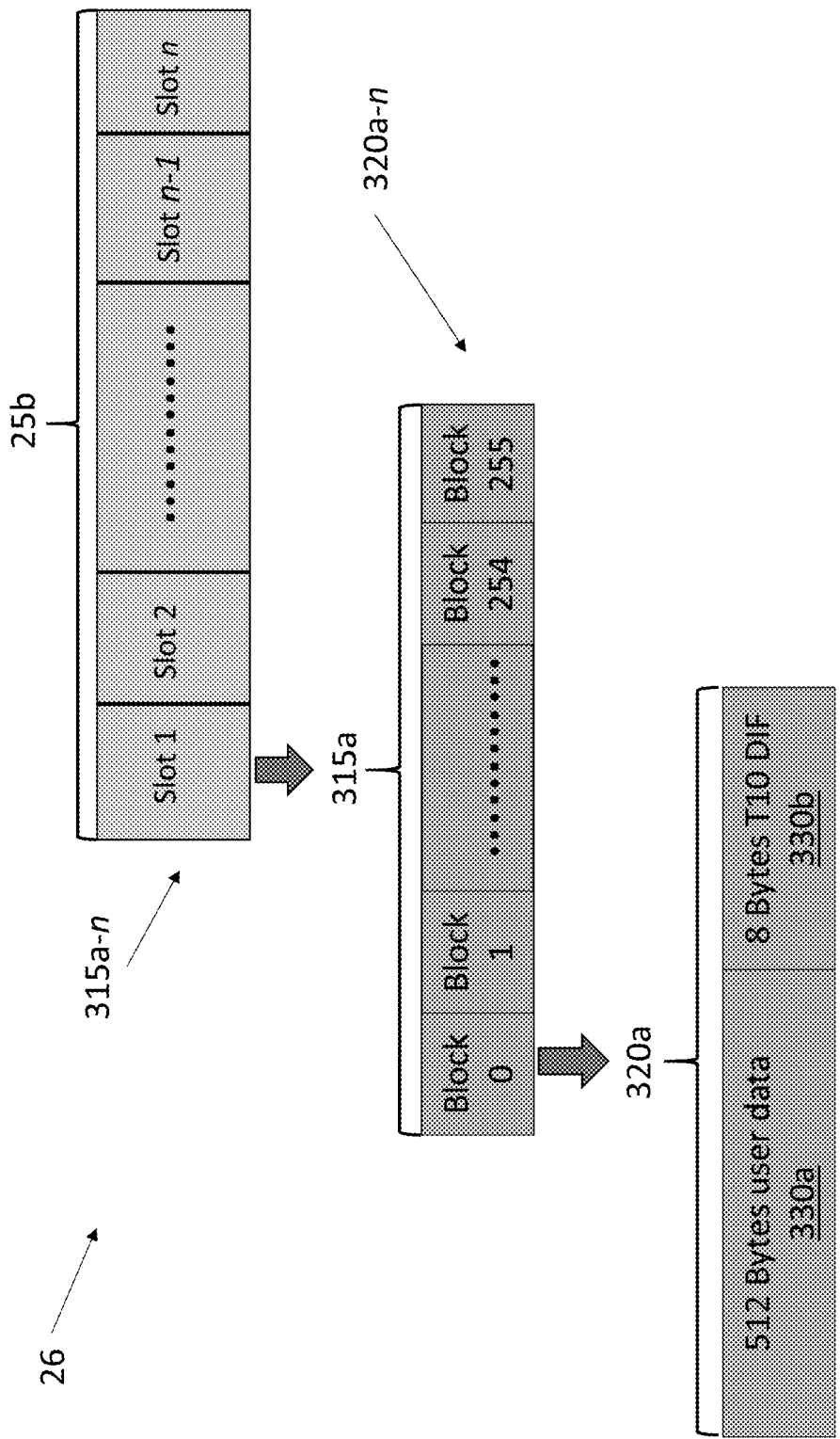
FIG. 3 is a block diagram of memory in accordance with example embodiments disclosed herein.

Referring briefly to FIG. 3, the controller can also monitor one or more cache slots 315a-n of the global memory 25b using such techniques. The cache slots 315a-n can correspond to back-end of cache slots. As is known, back-end cache slots can be configured to temporarily store data to be de-staged to one or more of permanent storage devices (e.g., disks 16a-n of FIG. 1). Each of the cache slots 315a-n, can include data blocks 320a-n. In the embodiments, each of the slots 315a-n includes 256 data blocks. However, each of the cache slots 315a-n can be configured to include any amount of data blocks. Additionally, each of the data blocks 320a-n can include a user data portion 330a and a data integrity field (DIF) portion 330b. Although the user data portion 330a and the DIF portion 330b are illustrated as being 512 bytes and 8 bytes in size, respectively, each of the data portions 330a-b can have any known byte size. In embodiments, the DIF portion 330b can have a T10 DIF lay out, which can include T10 DIF protection data (a portion of which includes cyclic redundancy check (CRC) data), an application tag, device number, track head value, sector signature, and block number, amongst other information.

Referring back to FIG. 2, the controller 134 can send a control signal to a verification processor 138 to verify the compressed data. The verification processor 138 can include logic and/or circuitry to verify the compressed data to verify the compressed data.

In embodiments, the verification processor 138 can determine a data verification level amongst a plurality of verification levels to perform. In response to selecting a lowest verification level, the processor 138 can perform a verification technique that provides a quick response (e.g., a verification response within a first response time window) with a least compressed data integrity confidence level. In contrast, the processor 138 can perform a verification technique that provides a slowest response (e.g., a verification response within a second response time window) with a highest compressed data integrity confidence level. It should be noted that there can be any number of verification levels and each verification level can indicate software/hardware resources required by the processor 138 to perform compression verification and a response time window within which a verification result can be reported. For ease of explanation, a lowest level and highest levels are described.

To select a verification level, the verification processor 138 can first perform a search of the telemetry data stored in the data store 136. Using information included in the telemetry data, the verification processor 138 can select a verification level for verifying the compressed data. For example, the telemetry data can include information such as system load, CPU bandwidth, current and/or anticipated workload, service levels corresponding to the current and/or anticipated workloads, and read-miss queue sizes, amongst other information.

In response to selecting a verification level, the processor 138 can read the compressed data from the back-end cache slots 315a-n and write it to a first buffer set 111 of the local buffers 110. The first buffer set 111 can be designated and sized to store compressed data.

Once the compressed data is written to the first buffer set 111, the controller 134 can reverse compress the compressed data according to any of the techniques described herein. The processor 138 can write the reverse compressed data to a second buffer set 112 of the local buffers 110. The second buffer set 112 can be designated and sized to store reverse compressed data. In embodiments, the second buffer set 112 can sized based on a largest possible expected size of original uncompressed data. The controller 134 can compare the reverse compressed data stored in the second buffer set 112 to its original counterpart. In embodiment, the processor 138 can compare one or both of the user data portion 330a and the DIF portion 330b of the reverse compressed data block 320a with those respective portions of its original uncompressed data block. For instance, the processor 138 can compare the CRC data and T10 DIF protection data contained in the T10 DIF portions of each of the reverse compressed data and its original uncompressed data counterpart.

In embodiments, the processor 138 can compare the reverse compressed data with its original uncompressed data counterpart copied and stored in a local buffer (e.g., one of the buffers 110 of FIG. 1) from the global memory 25b. The uncompressed data counterpart can be stored in one or more front-end cache slots of the global memory 25b. The front-end cache slots can be configured to receive data from the HA 21 of FIG. 1 can cache it for storage processing. In embodiments, the front-end cache slots can be mirrored cache slots. Additionally, they can be designated to cache data designated to be compressed and stored to one or more of the disks 16a-n of FIG. 1.

As stated herein, a selected data verification level (e.g., lowest to highest) can define parameters for reverse compression.

For example, a lowest data verification level can signal the processor 138 to reverse compress a single block of data (e.g., block 320a of FIG. 3). The processor 138 can sequentially select the single block of data or use any known selection technique. Once the block of data is selected, the verification processor 138 reverse compresses the block of data. The processor 138 can then compare the reverse compressed block of data 320a with its counterpart original uncompressed data stored in global memory 25b. By only selecting the selecting the single block of data 320a, the processor 138 is able to return a verification result within a quickest response time window and utilize minimal resources. Thus, the processor 138 can verify compressed data even during periods of high workloads.

A highest data verification level can signal the processor 138 to reverse compress at least two or more blocks of data. Once the blocks of data are selected, the verification processor 138 reverse compresses them. In embodiments, the processor 138 performs a reverse compression technique by selecting blocks of data as described herein (e.g., sequentially or by randomly selecting a one or more sets of data blocks). The processor 138 can then compare the reverse compressed blocks of data with their counterpart original uncompressed data blocks stored in global memory 25b. Because the highest data verification level may require a significant amount of computing resources and return a verification results within a response time window subsequent to a threshold response time window, the processor 138 may only select such a verification level during low workload periods with larger amounts of available resources.

In response to detecting a mismatch, the processor 138 can report an error and clear the back-end cache slot data storing the corrupted compressed data block. The processor 138 can then re-attempt compressing the corrupted data's original uncompressed counterpart.

In response to detecting a match, the processor 138 can indicate that the compressed data is verified and release it from the first local buffer set 111 for the DA 30 to write it to disk.

Figure 4:
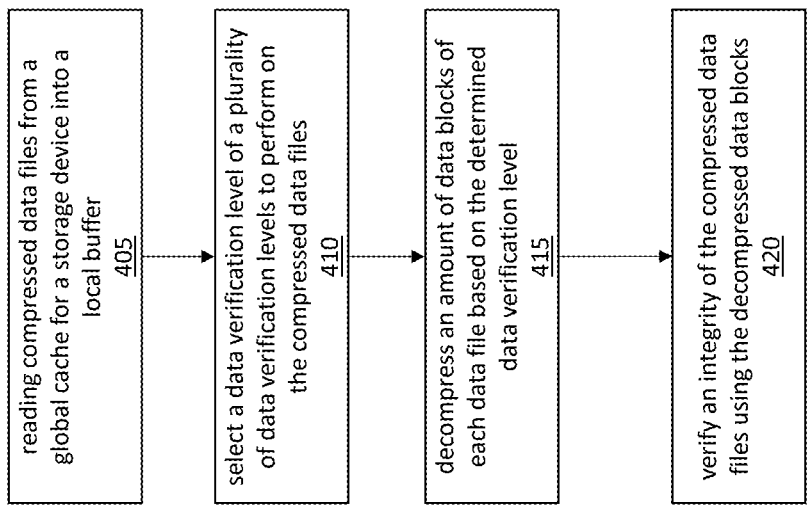
FIG. 4 is a flow diagram of a method for verifying compressed data in accordance with example embodiments disclosed herein.

FIG. 4 illustrates a method and/or flow diagram in accordance with this disclosure. For simplicity of explanation, the method is depicted and described as a series of acts. However, acts in accordance with this disclosure can occur in various orders and/or concurrently, and with other acts not presented and described herein. Furthermore, not all illustrated acts may be required to implement the method in accordance with the disclosed subject matter.

Referring to FIG. 4, in embodiments, a method 400 can be executed by a compression engine (e.g., engine 105 of FIG. 1). The method 400, at 405, can include reading compressed data files from a global cache for a storage device into a local buffer. At 410, the method 400 can also include selecting a data verification level of a plurality of data verification levels to perform on the compressed data files. Selecting the data verification level can include determining telemetry information of the storage device. The selected data verification level can be based on the determined telemetry information. Additionally, the method 400, at 415, can include decompressing an amount of data blocks of each data file based on the determined data verification level. Further, at 420, the method 400 can include verifying an integrity of the compressed data files using the decompressed data blocks. The plurality of data verification levels can include at least a first compression verification level and a second verification level. Each verification level can require distinct computing resources and a distinct verification response time. The method 400, at 420, can also include decompressing a single data block of each read compressed data file in response to selecting a data verification level having a verification response time less than a threshold.

In embodiments, at 420, the method 400 can further include comparing each single decompressed data block of each compressed data file to at least one data block of a corresponding uncompressed data file stored in global memory. The comparison can include determining a similarity between information contained a cyclic redundancy check (CRC) field and a data integrity field (DIF) of the single data block and the at least one data block of the corresponding uncompressed data file. A similarity finding can indicate that the read compressed data files from the global cache are verified. A lack of a similarity finding can indicate that the read compressed data files from the global cache are unverified.

In other embodiments, the method 400, at 420, can further include comparing each of the two or more decompressed data block of each compressed data file to a plurality of data blocks of a corresponding uncompressed data file stored in global memory. The comparison can include determining a similarity between information contained a cyclic redundancy check (CRC) field and a data integrity field (DIF) of the single data block and the at least one data block of the corresponding uncompressed data file. A similarity finding can indicate that the read compressed data files from the global cache are verified. A lack of a similarity finding can indicate that the read compressed data files from the global cache are unverified.

In embodiments, the method 400, at 420, can also include writing all verified compressed data files to one or more disks of the storage device.

It should be noted that each step of the method 400 can be performed according to any of the embodiments described herein, known to those skilled in the art, and/or yet to be known to those skilled in the art.

The above-described systems and methods can be implemented in digital electronic circuitry, in computer hardware, firmware, and/or software. The implementation can be as a computer program product. The implementation can, for example, be in a machine-readable storage device, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the concepts described herein by operating on input data and generating output. Method steps can also be performed by and an apparatus can be implemented as special purpose logic circuitry. The circuitry can, for example, be a FPGA (field programmable gate array) and/or an ASIC (application-specific integrated circuit). Subroutines and software agents can refer to portions of the computer program, the processor, the special circuitry, software, and/or hardware that implement that functionality.

Processors suitable for the execution of a computer program include, by way of example, both general and special purpose microprocessors, and any one or more processors of any kind of digital computer. Generally, a processor receives instructions and data from a read-only memory or a random-access memory or both. The essential elements of a computer are a processor for executing instructions and one or more memory devices for storing instructions and data. Generally, a computer can include, can be operatively coupled to receive data from and/or transfer data to one or more mass storage devices for storing data (e.g., magnetic, magneto-optical disks, or optical disks).

Data transmission and instructions can also occur over a communications network. Information carriers suitable for embodying computer program instructions and data include all forms of non-volatile memory, including by way of example semiconductor memory devices. The information carriers can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a user, the above described embodiments can be implemented on a computer having a display device. The display device can, for example, be a cathode ray tube (CRT) and/or a liquid crystal display (LCD) monitor. The interaction with a user can, for example, be a display of information to the user and a keyboard and a pointing device (e.g., a mouse or a trackball) by which the user can provide input to the computer (e.g., interact with a user interface element). Other kinds of devices can be used to provide for interaction with a user. Other devices can, for example, be feedback provided to the user in any form of sensory feedback (e.g., visual feedback, auditory feedback, or tactile feedback). Input from the user can, for example, be received in any form, including acoustic, speech, and/or tactile input.

The above described embodiments can be implemented in a distributed computing system that includes a back-end component. The back-end component can, for example, be a data server, a middleware component, and/or an application server. The above described embodiments can be implemented in a distributing computing system that includes a front-end component. The front-end component can, for example, be a client computer having a graphical user interface, a Web browser through which a user can interact with an example implementation, and/or other graphical user interfaces for a transmitting device. The components of the system can be interconnected by any form or medium of digital data communication (e.g., a communication network). Examples of communication networks include a local area network (LAN), a wide area network (WAN), the Internet, wired networks, and/or wireless networks.

The system can include clients and servers. A client and a server are generally remote from each other and typically interact through a communication network. The relationship of client and server arises by computer programs running on the respective computers and having a client-server relationship to each other.

Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, Hiper-LAN), and/or other packet-based networks. Circuit-based networks can include, for example, the public switched telephone network (PSTN), a private branch exchange (PBX), a wireless network (e.g., RAN, Bluetooth, code-division multiple access (CDMA) network, time division multiple access (TDMA) network, global system for mobile communications (GSM) network), and/or other circuit-based networks.

The transmitting device can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a world wide web browser (e.g., Microsoft® Internet Explorer® available from Microsoft Corporation, Mozilla® Firefox available from Mozilla Corporation). The mobile computing device includes, for example, a Blackberry®.

Comprise, include, and/or plural forms of each are open ended and include the listed parts and can include additional parts that are not listed. And/or is open ended and includes one or more of the listed parts and combinations of the listed parts.

One skilled in the art will realize the concepts described herein may be embodied in other specific forms without departing from the spirit or essential characteristics thereof. The foregoing embodiments are therefore to be considered in all respects illustrative rather than limiting of the concepts described herein. Scope of the concepts is thus indicated by the appended claims, rather than by the foregoing description, and all changes that come within the meaning and range of equivalency of the claims are therefore intended to be embraced therein.

What is claimed is:

1. An apparatus configured to at least one processor configured to:
   read compressed data files from a global cache for a storage device into a local buffer;
   select a data verification level of a plurality of data verification levels to perform on the compressed data files, wherein selecting the data verification level includes determining telemetry information of the storage device;
   decompress an amount of data blocks of each data file based on the determined data verification level; and
   verify an integrity of the compressed data files using the decompressed data blocks.

2. The apparatus of claim 1, wherein the plurality of data verification levels includes at least a first compression verification level and a second verification level, wherein each verification level requires distinct computing resources and a distinct verification response time.

3. The apparatus of claim 1, wherein the selected data verification level is based on the determined telemetry information.

4. The apparatus of claim 1 further configured to decompress a single data block of each read compressed data file in response to selecting a data verification level having a verification response time less than a threshold.

5. The apparatus of claim 4 further configured to compare each single decompressed data block of each compressed data file to at least one data block of a corresponding uncompressed data file stored in global memory.

6. The apparatus of claim 5, wherein:
   the comparison includes determining a similarity between information contained a cyclic redundancy check (CRC) field and a data integrity field (DIF) of the single data block and the at least one data block of the corresponding uncompressed data file;
   a similarity finding indicates that the read compressed data files from the global cache are verified; and
   a lack of a similarity finding indicates that the read compressed data files from the global cache are unverified.

7. The apparatus of claim 1 further configured to decompress two or more data blocks of each read compressed data file in response to selecting a data verification level having a verification response time greater than a threshold.

8. The apparatus of claim 7 further configured to:
   compare each of the two or more decompressed data block of each compressed data file to a plurality of data blocks of a corresponding uncompressed data file stored in global memory; and
   wherein:
   the comparison includes determining a similarity between information contained a cyclic redundancy check (CRC) field and a data integrity field (DIF) of a single data block and the plurality of data blocks of the corresponding uncompressed data file,
   a similarity finding indicates that the read compressed data files from the global cache are verified, and
   lack of a similarity finding indicates that the read compressed data files from the global cache are unverified.

9. The apparatus of claim 1 further configured to write all verified compressed data files to one or more disks of the storage device.

10. A method comprising:
    reading compressed data files from a global cache for a storage device into a local buffer;
    selecting a data verification level of a plurality of data verification levels to perform on the compressed data files, wherein selecting the data verification level includes determining telemetry information of the storage device;
    decompressing an amount of data blocks of each data file based on the determined data verification level; and
    verifying an integrity of the compressed data files using the decompressed data blocks.

11. The method of claim 10, wherein the plurality of data verification levels includes at least a first compression verification level and a second verification level, wherein each verification level requires distinct computing resources and a distinct verification response time.

12. The method of claim 10, wherein the selected data verification level is based on the determined telemetry information.

13. The method of claim 10 further comprising decompressing a single data block of each read compressed data file in response to selecting a data verification level having a verification response time less than a threshold.

14. The method of claim 13 further comprising comparing each single decompressed data block of each compressed data file to at least one data block of a corresponding uncompressed data file stored in global memory.

15. The method of claim 14, wherein:
the comparison includes determining a similarity between information contained a cyclic redundancy check (CRC) field and a data integrity field (DIF) of the single data block and the at least one data block of the corresponding uncompressed data file;
a similarity finding indicates that the read compressed data files from the global cache are verified; and
lack of a similarity finding indicates that the read compressed data files from the global cache are unverified.

16. The method of claim 10 further comprising decompressing two or more data blocks of each read compressed data file in response to selecting a data verification level having a verification response time greater than a threshold.

17. The method of claim 16 further comprising:
comparing each of the two or more decompressed data block of each compressed data file to a plurality of data blocks of a corresponding uncompressed data file stored in global memory; and
wherein:
the comparison includes determining a similarity between information contained a cyclic redundancy check (CRC) field and a data integrity field (DIF) of a single data block and the plurality of data blocks of the corresponding uncompressed data file,
a similarity finding indicates that the read compressed data files from the global cache are verified, and
lack of a similarity finding indicates that the read compressed data files from the global cache are unverified.

18. The method of claim 10 further comprising writing all verified compressed data files to one or more disks of the storage device.

* * * * *